(12) United States Patent
Bröll et al.

(10) Patent No.: US 10,026,871 B2
(45) Date of Patent: Jul. 17, 2018

(54) METHOD FOR PRODUCING AN OPTOELECTRONIC DEVICE WITH A CONTACT AREA OF ACCURATELY AND REPRODUCIBLY DEFINED SIZE

(71) Applicant: OSRAM Opto Semiconductors GmbH, Regensburg (DE)

(72) Inventors: Markus Bröll, Freising (DE); Christoph Klemp, Regensburg (DE); Wolfgang Schmid, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/878,634

(22) Filed: Jan. 24, 2018

(65) Prior Publication Data

US 2018/0151777 A1    May 31, 2018

Related U.S. Application Data

(62) Division of application No. 14/888,681, filed as application No. PCT/EP2014/058357 on Apr. 24, 2014, now Pat. No. 9,882,090.

(30) Foreign Application Priority Data

May 14, 2013  (DE) .................. 10 2013 104 953

(51) Int. Cl.
*H01L 33/38* (2010.01)
*H01L 33/42* (2010.01)
*H01L 33/62* (2010.01)
*H01L 33/46* (2010.01)
*H01L 33/40* (2010.01)
(Continued)

(52) U.S. Cl.
CPC ............ *H01L 33/38* (2013.01); *H01L 33/405* (2013.01); *H01L 33/42* (2013.01); *H01L 33/46* (2013.01); *H01L 33/62* (2013.01); *H01L 33/10* (2013.01); *H01L 33/36* (2013.01); *H01L 2933/0016* (2013.01); *H01L 2933/0066* (2013.01)

(58) Field of Classification Search
CPC ....... H01L 33/36; H01L 33/38; H01L 33/405; H01L 33/42; H01L 33/46; H01L 33/10
See application file for complete search history.

(56) References Cited

U.S. PATENT DOCUMENTS 4,029,562 A    6/1977  Feng et al.
4,410,622 A    10/1983  Dalai et al.
(Continued)

FOREIGN PATENT DOCUMENTS

CN    101320778 A    12/2008
CN    102263170 A    11/2011
(Continued)

*Primary Examiner* — Scott B Geyer
(74) *Attorney, Agent, or Firm* — Slater Matsil, LLP

(57) ABSTRACT

An optoelectronic device is disclosed. In an embodiment the device includes a semiconductor crystal with a surface having a first lateral region, a second lateral region and a third lateral region, a contact area arranged on the surface in the first lateral region, the contact area comprising a first metal and a first layer including a dielectric arranged on the surface in the third lateral region. The device further includes a second layer having an optically transparent, electrically conductive material arranged on the contact area, the first layer and the second lateral region of the surface and a third layer having a second metal arranged on the second layer.

15 Claims, 5 Drawing Sheets

(51) Int. Cl.
  *H01L 33/36* (2010.01)
  *H01L 33/10* (2010.01)

(56) References Cited

U.S. PATENT DOCUMENTS

| | | |
|---|---|---|
| 4,495,220 A | 1/1985 | Wolf et al. |
| 4,640,738 A | 2/1987 | Fredericks et al. |
| 4,771,017 A | 9/1988 | Tobin et al. |
| 4,927,782 A | 5/1990 | Davey et al. |
| 5,007,873 A | 4/1991 | Goronkin et al. |
| 5,284,798 A | 2/1994 | Ibuka et al. |
| 5,434,451 A | 7/1995 | Dalal et al. |
| 5,461,009 A | 10/1995 | Huang et al. |
| 5,830,774 A | 11/1998 | Klingbeil, Jr. et al. |
| 6,004,874 A | 12/1999 | Cleeves |
| 7,795,144 B2 | 9/2010 | Hirao |
| 8,866,293 B2 | 10/2014 | Lin et al. |
| 9,076,931 B2 | 7/2015 | Schmid et al. |
| 2004/0114652 A1 | 6/2004 | Yoshikawa |
| 2008/0305631 A1 | 12/2008 | Hirao |
| 2011/0291140 A1 | 12/2011 | Choi et al. |

FOREIGN PATENT DOCUMENTS

| | | |
|---|---|---|
| CN | 102769006 A | 11/2012 |
| DE | 10261364 A1 | 8/2004 |
| DE | 102010049186 A1 | 4/2012 |
| EP | 2390934 A2 | 11/2011 |
| WO | 2012052415 A1 | 4/2012 |

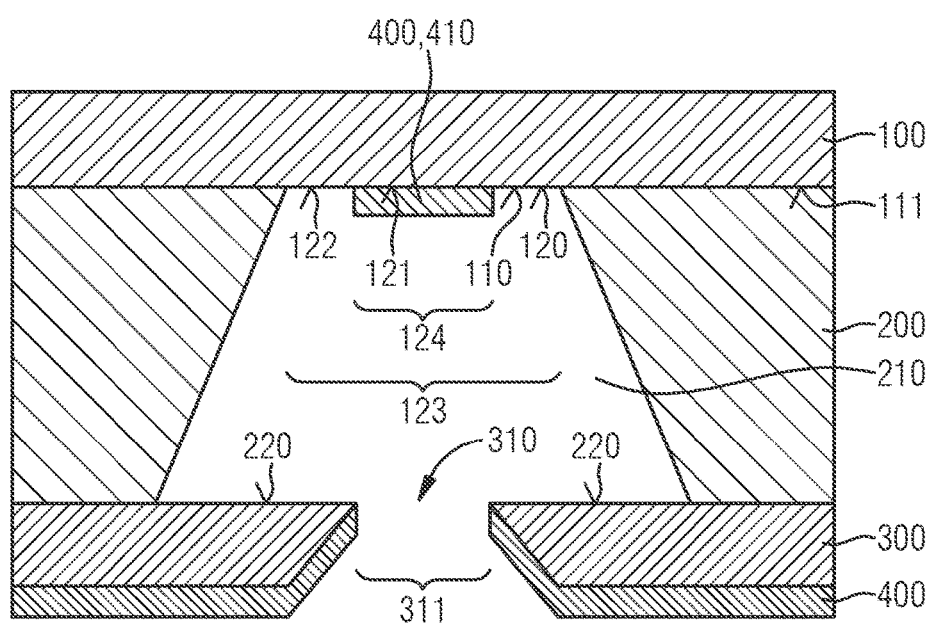
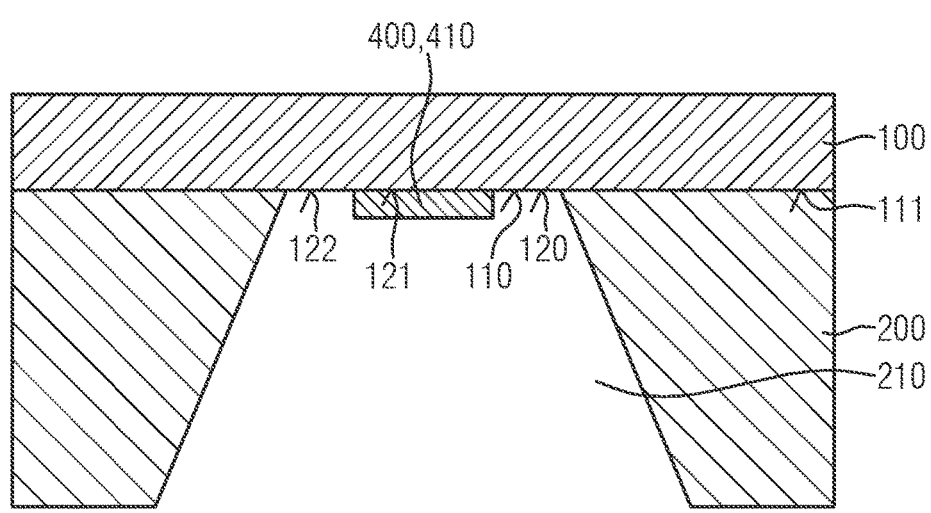

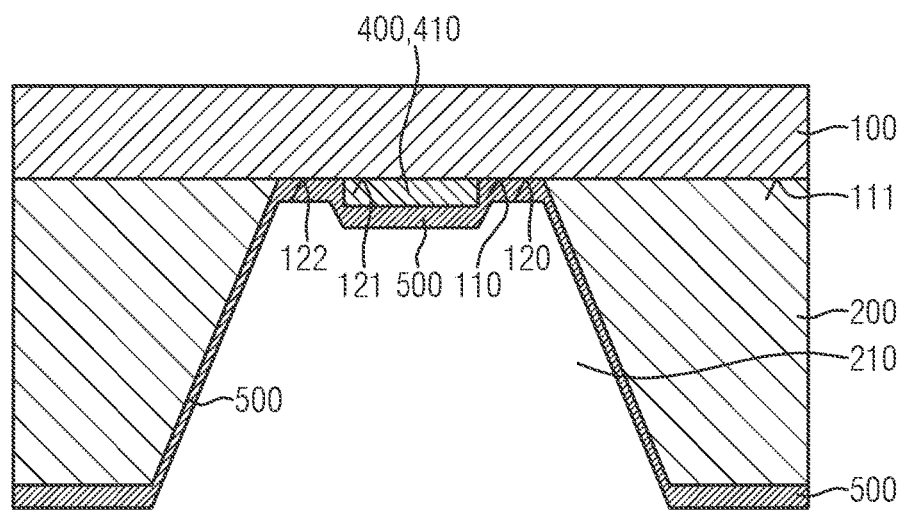
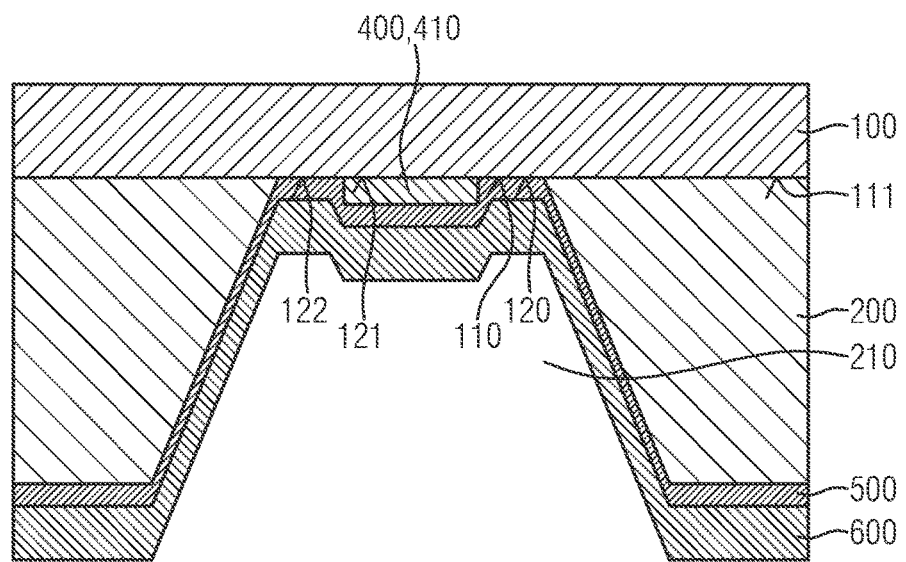

METHOD FOR PRODUCING AN OPTOELECTRONIC DEVICE WITH A CONTACT AREA OF ACCURATELY AND REPRODUCIBLY DEFINED SIZE

CROSS-REFERENCE TO RELATED APPLICATIONS

This application is a divisional application of U.S. application Ser. No. 14/888,681, which was filed on Nov. 2, 2015 and issued as U.S. Pat. No. 9,882,090 on Jan. 30, 2018 which is a national phase filing under section 371 of PCT/EP2014/058357, filed Apr. 24, 2014, which claims the priority of German patent application 10 2013 104 953.2, filed May 14, 2013, each of which is incorporated herein by reference in its entirety.

TECHNICAL FIELD

The present invention relates to a method for producing an optoelectronic device and to an optoelectronic device.

BACKGROUND

In optoelectronic devices with semiconductor crystals, it is necessary that contact areas for electrical contacting be reproducibly provided with an optimum contact size. For example, it is necessary in light-emitting diode devices reproducibly to produce optimally dimensioned contact areas in order to achieve low forward voltages and high light yields.

A prior art method is known for producing light-emitting diode chips (LED chips) using thin-film technology in which, in a first lithographic method step, a contact area of metal is provided. In a second method step, a layer of a mirror dielectric which covers the contact area is applied. The mirror dielectric is then opened up in the region of the contact area by means of a photolithographic method. A mirror metal which simultaneously provides electrical contacting for the contact area is then deposited. As a result of adjustment tolerances during the lithographic process steps, this method gives rise to a scatter of the effective size of the contact area.

SUMMARY

Embodiments of the present invention provide a method for producing an optoelectronic device. Further embodiments of the present invention provide an optoelectronic device.

A method for producing an optoelectronic device comprises steps of providing a semiconductor crystal which has a surface, of applying a first layer which comprises a dielectric onto the surface, of applying and patterning a photoresist layer on the first layer, wherein the photoresist layer is patterned in such a manner that it comprises an opening, of partially dissolving away the first layer in order to uncover a lateral region of the surface, of applying a contact area which comprises a first metal in the lateral region of the surface, of removing the photoresist layer, of applying a second layer which comprises an optically transparent, electrically conductive material, and of applying a third layer which comprises a second metal. This method advantageously produces an optoelectronic device with a semiconductor crystal with a contact area, the size of which may be defined by the size of the opening in the photoresist layer. This advantageously makes it possible to define the size of the contact area highly accurately and reproducibly. The entire size of the contact area advantageously serves for electrically contacting the semiconductor crystal, whereby it is not necessary to make the contact area larger than necessary in order to compensate a tolerance. As a result, it is advantageously possible to minimise absorption of light generated in the semiconductor crystal at the contact area, for which reason the optoelectronic device produced by the method may have a higher light yield. A further advantage of the method is that it requires just one photolithographic process step, whereby the method may be carried out inexpensively.

In one embodiment of the method, the photoresist layer comprises a positive resist. The photoresist layer can then advantageously be patterned by exposing only the region in which the opening is to be produced.

In one embodiment of the method, the first layer is partially dissolved away by wet chemical etching. As a result, the method may advantageously be carried out simply and inexpensively.

In one embodiment of the method, the photoresist layer is partially underetched while the first layer is being dissolved away. Partial underetching advantageously ensures that the size of the resultant contact area highly accurately matches the size of the opening in the patterned photoresist layer.

An optoelectronic device comprises a semiconductor crystal with a surface which comprises a first lateral region, a second lateral region and a third lateral region. In the first lateral region, a contact area is here arranged on the surface which comprises a first metal. In the third lateral region, a first layer is arranged on the surface which comprises a dielectric. A second layer which comprises an optically transparent, electrically conductive material is arranged on the contact area, the first layer and the second lateral region of the surface. A third layer which comprises a second metal is here arranged on the second layer. In this optoelectronic device, the entire area of the contact area advantageously serves for electrically contacting the semiconductor crystal, whereby the contact area may be formed with small dimensions. Light absorption at the contact area is advantageously reduced as a consequence, whereby a light yield of the optoelectronic device may be improved. One advantage is that light absorption in the second lateral region is substantially lower than light absorption in the first lateral region at the contact area. As a result, both a forward voltage of the optoelectronic device and a light yield of the optoelectronic device are virtually independent of the size of the second lateral region. This enables simple and inexpensive production of the optoelectronic device. A further advantage may be that the second layer serves as a bonding agent between the first layer and the third layer.

In one embodiment of the optoelectronic device, a specific contact resistance between the second layer and the semiconductor crystal is at least one order of magnitude higher than a specific contact resistance between the contact area and the semiconductor crystal. As a result, the second layer advantageously electrically contacts the semiconductor crystal substantially less than the contact area. The consequence of this is that a forward voltage of the optoelectronic device is determined only by the contact area. This advantageously gives rise to high reproducibility of the forward voltage.

In one embodiment of the optoelectronic device, the second lateral region at least in places annularly surrounds the first lateral region. As a result, the second lateral region advantageously forms a safety gap between the contact area and the first layer of the optoelectronic device. This enables production of the contact area with a reproducible size.

In one embodiment of the optoelectronic device, the third lateral region at least in places annularly surrounds the second lateral region. As a result, the contact area is advantageously arranged in an opening of the first layer arranged and is spaced from the first layer, whereby the contact area can be produced with a readily reproducible size.

In one embodiment of the optoelectronic device, the optically transparent, electrically conductive material is a transparent, electrically conductive oxide. Transparent, electrically conductive oxides advantageously have a low optical absorbency and electrically contact semiconductor crystals with a high contact resistance. Transparent, electrically conductive oxides are here advantageously nevertheless suitable for electrically contacting the contact area.

In one embodiment of the optoelectronic device, the first metal and/or the second metal is gold or silver. These metals advantageously have favourable optical and electrical properties.

In one embodiment of the optoelectronic device, the dielectric comprises $SiO_2$. As a result, reflectivity of the third layer is advantageously improved.

BRIEF DESCRIPTION OF THE DRAWINGS

The above-described characteristics, features and advantages of this invention and the manner in which these are achieved will become clearer and more distinctly comprehensible from the following description of the exemplary embodiments, which are explained in greater detail in connection with the drawings, in which in each case in a schematic representation

FIG. 5 shows the semiconductor crystal, the first layer and the photoresist layer after application of a metal layer;

FIG. 6 shows the semiconductor crystal, the first layer and a contact area after detachment of the photoresist layer;

FIG. 7 shows the unfinished optoelectronic device after application of a second layer;

FIG. 8 shows the unfinished optoelectronic device after application of a third layer.

DETAILED DESCRIPTION OF ILLUSTRATIVE EMBODIMENTS

Figure 1:
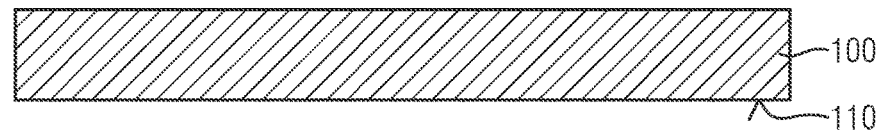
FIG. 1 shows a semiconductor crystal for producing an optoelectronic device.

FIG. 1 shows a highly schematic sectional representation of a semiconductor crystal 100. The semiconductor crystal 100 may, for example, be produced by epitaxial growth. The semiconductor crystal 100 has a surface 110.

The semiconductor crystal 100 is provided for producing an optoelectronic device, for which purpose further processing steps, which are explained below, are required. The optoelectronic device may, for example, be a light-emitting diode device.

Figure 2:
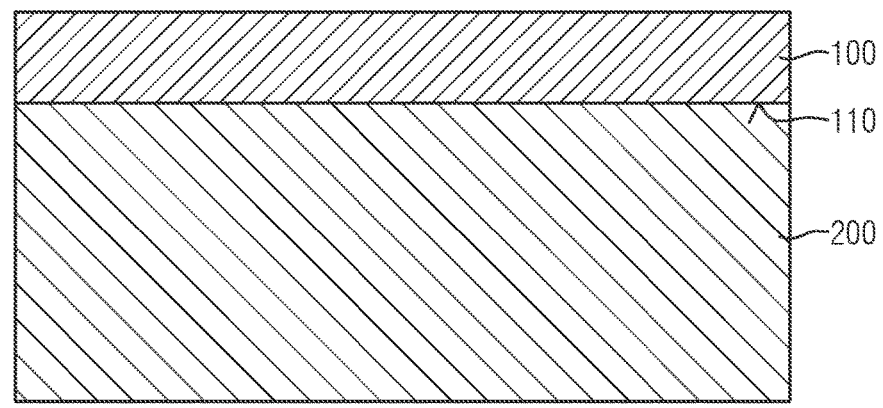
FIG. 2 shows the semiconductor crystal with an applied first layer.

FIG. 2 shows a schematic sectional representation of the semiconductor crystal 100 in a processing state chronologically subsequent to the representation of FIG. 1. A two-dimensional first layer 200 has been arranged on the surface 110 of the semiconductor crystal 100. The first layer 200 comprises a dielectric which serves as mirror dielectric. The first layer 200 may, for example, comprise silicon dioxide ($SiO_2$). The first layer 200 may, for example, have been applied by chemical vapour deposition onto the surface 110 of the semiconductor crystal 100.

Figure 3:
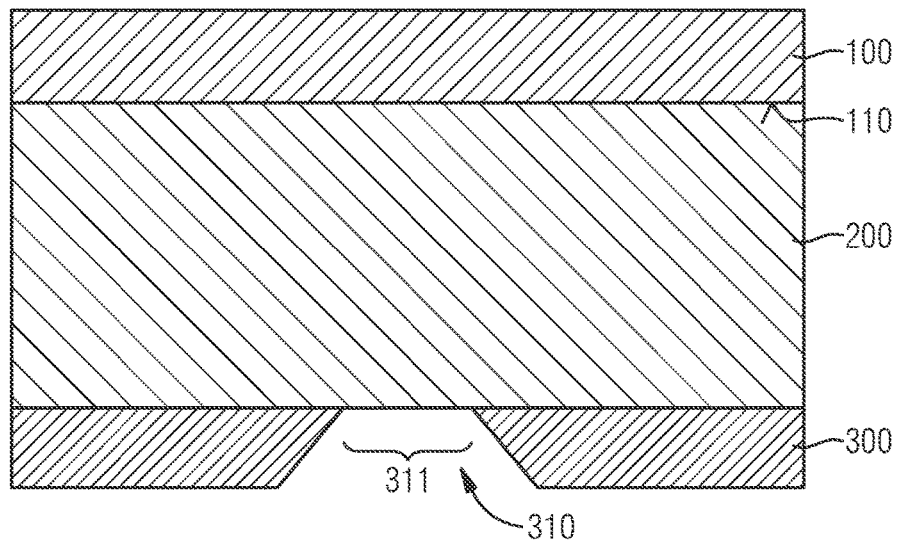
FIG. 3 shows the first layer with a patterned photoresist layer arranged thereon.

FIG. 3 shows a schematic sectional representation of the semiconductor crystal 100 in a processing state chronologically subsequent to the representation of FIG. 2. A photoresist layer 300 has been arranged on the side of the first layer 200 remote from the semiconductor crystal 100. The photoresist layer 300 has moreover been patterned in order to produce an opening 310 in the photoresist layer 300, through which the first layer 200 is accessible. The opening 310 in the photoresist layer 300 preferably has a circular disc-shaped cross-sectional area. The opening 310 may, however, also have another cross-sectional shape. The opening 310 has an opening diameter 311 in the lateral direction.

The photoresist layer 300 may comprise a positive resist. In this case, the photoresist of the photoresist layer 300 was exposed in the region of the opening 310. The exposed parts of the photoresist layer 300 were then dissolved away.

Figure 4:
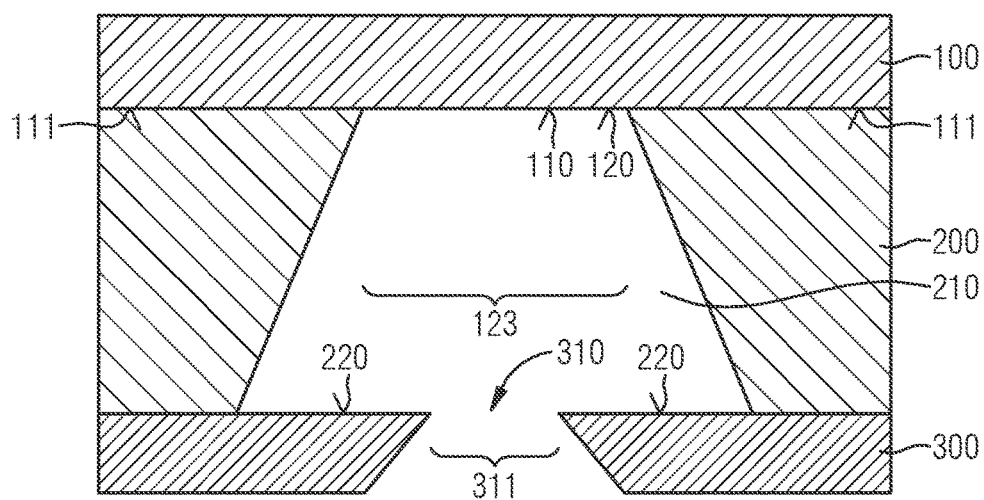
FIG. 4 shows the first layer after the first layer has been partially dissolved away.

FIG. 4 shows a schematic sectional representation of the semiconductor crystal 100 in a processing state chronologically subsequent to the representation of FIG. 3. The first layer 200 arranged on the surface 110 of the semiconductor crystal 100 has been partially removed. Removal of the part of the first layer 200 has preferably been performed by wet chemical etching. The wet chemical etchant has here attacked the first layer 200 through the opening 310 in the photoresist layer 300.

As a result of the first layer 200 having been partially dissolved away, an opening 210 accessible through the opening 310 in the photoresist layer 300 has arisen in the first layer 200, which opening 210 uncovers the surface 110 of the semiconductor crystal 100 in an uncovered lateral region 120. In a covered region in, the surface 110 of the semiconductor crystal 100 is still covered by the first layer 200 even after part of the first layer 200 has been dissolved away. The lateral region 120 of the surface 110 of the semiconductor crystal 100 uncovered by the opening 210 in the first layer 200 has an uncovered diameter 123. The uncovered diameter 123 is preferably larger than the opening diameter 311 of the opening 310 in the photoresist layer 300. In a projection perpendicular to the surface 110 of the semiconductor crystal 100, the centre points of the opening 310 in the photoresist layer 300 and the centre point of the uncovered lateral region 120 of the surface 110 of the semiconductor crystal 100 with the uncovered diameter 123 preferably lie approximately on one another.

Since the diameter of the opening 210 in the first layer 200 is larger in the lateral direction than the opening diameter 311 of the opening 310 in the photoresist layer 300, an underetch 220 has been formed under the photoresist layer 300. The photoresist layer 300 has thus been partially underetched while the first layer 200 was being partially dissolved away.

FIG. 5 shows a schematic sectional representation of the semiconductor crystal 100 in a processing state chronologically subsequent to the representation of FIG. 4. A metal layer 400 has been deposited from the photoresist layer 300 side. The metal layer 400 has settled on the side of the photoresist layer 300 remote from the first layer 200. Material of the metal layer 400 has moreover passed through the opening 310 in the photoresist layer 300 to reach the uncovered lateral region 120 of the surface 110 of semiconductor crystal 100 and has there formed a contact area 410. The contact area 410 covers the uncovered lateral region 120 of the surface 110 of the semiconductor crystal 100 in a contact region 121. The contact region 121 is approximately centrally arranged in the uncovered lateral region 120 of the surface 110 of the semiconductor crystal 100 and is bordered to the outside by a tolerance region 122, which is annular or at least in places annular, of the uncovered lateral region 120. The tolerance region 122 of the uncovered lateral region 120 is surrounded to the outside annularly or at least in places annularly by the covered region 111 of the surface 110 of the semiconductor crystal 100.

The contact area 410 has a contact diameter 124 in the lateral direction which is smaller than the uncovered diameter 123. The contact diameter 124 of the contact area 410 approximately matches that of the opening diameter 311 of the opening 310 in the photoresist layer 300. The opening diameter 311 of the opening 310 in the photoresist layer 300 thus defines the contact diameter 124 of the contact area 410.

The metal layer 400 comprises an electrically conductive material. The metal layer 400 may, for example, comprise gold or silver. The metal layer 400 may also comprise a bonding agent such as platinum, titanium or chromium which is applied prior to application of the remainder of the metal layer 400 in order to improve adhesion of the metal layer 400.

The contact area 410 formed from the metal layer 400 is in good electrical contact with the semiconductor crystal 100. A specific contact resistance between the contact area 410 and the semiconductor crystal 100 is preferably low.

The underetch 220 of the photoresist layer 300 ensures that the part of the metal layer 400 arranged on the photoresist layer 300 is not connected to the part of the metal layer 400 which forms the contact area 410. This allows the part of the metal layer 400 arranged on the photoresist layer 300 to be lifted off using a lift-off method.

FIG. 6 shows a schematic sectional representation of the semiconductor crystal 100 in a processing state chronologically subsequent to the representation of FIG. 5. The photoresist layer 300 has been removed together with the part of the metal layer 400 arranged on the photoresist layer 300. On the surface 110 of the semiconductor crystal 100, there thus remain the first layer 200 with the opening 210 and the contact area 410 arranged in the contact region 121 of the uncovered lateral region 120 of the surface 110 of the semiconductor crystal 100.

FIG. 7 shows a schematic sectional representation of the semiconductor crystal 100 in a processing state chronologically subsequent to the representation of FIG. 6. A second layer 500 has been arranged on the surface 110 of the semiconductor crystal 100, the contact area 410 and the first layer 200. The second layer 500 covers the side of the first layer 200 remote from the semiconductor crystal 100, the tolerance region 122 of the uncovered lateral region 120 of the surface 110 of the semiconductor crystal 100, the contact area 410 and preferably also the wall of the opening 210 in the first layer 200.

The second layer 500 comprises a transparent, electrically conductive material. The second layer 500 may, for example, comprise a transparent, electrically conductive oxide such as for instance doped zinc oxide, indium-zinc oxide or indium-tin oxide. The transparent, conductive material is transparent in an electromagnetic wavelength range which comprises a wavelength of the electromagnetic radiation emitted by the optoelectronic device which is produced from the semiconductor crystal 100. The transparent, conductive material may, for example, have an absorption coefficient of 1000 per centimeter.

The material of the second layer 500 scarcely electrically contacts the semiconductor crystal 100 in the tolerance region 122 of the surface 110 of the semiconductor crystal 100. There is preferably a very high specific contact resistance between the second layer 500 and the semiconductor crystal 100. The specific contact resistance between the second layer 500 and the semiconductor crystal 100 is at least one order of magnitude higher than the specific contact resistance between the contact area 410 and the semiconductor crystal 100. There is an electrically highly conductive connection between the contact area 410 and the second layer 500.

FIG. 8 shows a schematic representation of the semiconductor crystal 100 in a processing state chronologically subsequent to the representation of FIG. 7. A third layer 600 has been applied onto the second layer 500. The third layer 600 serves as mirror layer and preferably comprises a metal. The third layer 600 may, for example, comprise gold or silver. The second layer 500 arranged between the first layer 200 and the third layer 600 may serve as bonding agent for the third layer 600.

The third layer 600 is electrically conductively connected via the second layer 500 to the contact area 410. In an optoelectronic device produced from the semiconductor crystal 100, the third layer 600 may serve to guide an electrical contact to the contact area 410 to the outside.

Figure 9:
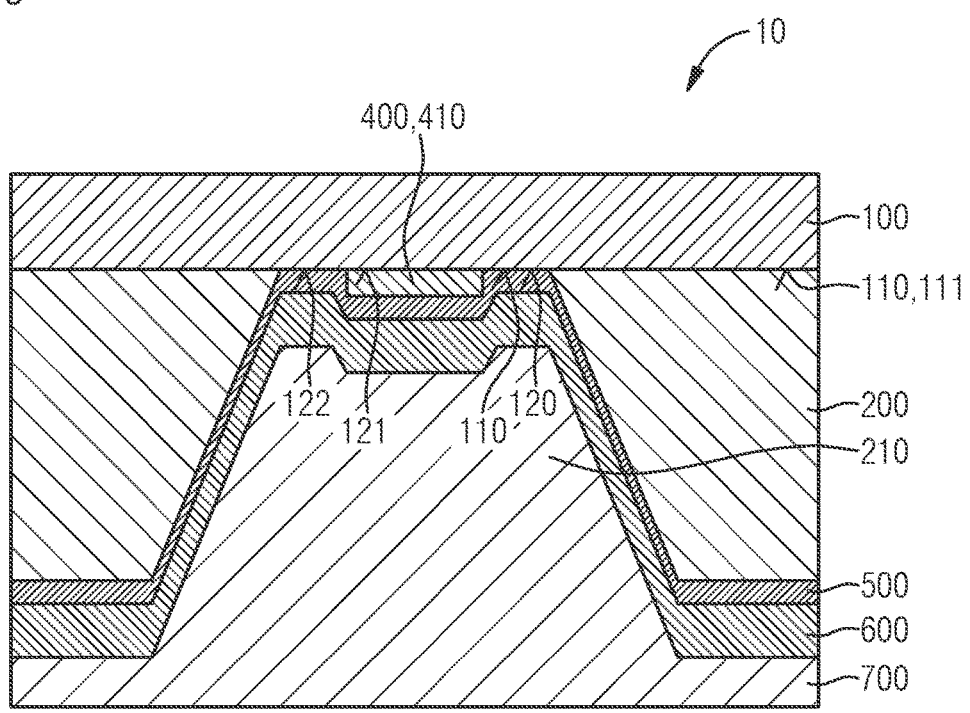
FIG. 9 shows the optoelectronic device after application of a fourth layer.

FIG. 9 shows a schematic sectional representation of the semiconductor crystal 100 in a processing state chronologically subsequent to the representation of FIG. 8. In the processing state shown in FIG. 9, the semiconductor crystal 100 is part of a largely finished optoelectronic device 10. The optoelectronic device 10 may, for example, be a light-emitting diode device. The semiconductor crystal 100 is then an LED chip.

A fourth layer 700 has been applied onto the third layer 600. The fourth layer 700 may serve as bonding layer to a carrier or substrate of the optoelectronic device 10.

The optoelectronic device 10 may be electrically contacted via the third layer 600 and the contact area 410, as well as the interposed second layer 500. The contact area 410 has the contact diameter 124 which is defined by the opening diameter 311 of the opening 310 of the photoresist layer 300, which opening diameter may be reproducibly established with elevated accuracy. The method described with reference to FIGS. 1 to 9 thus allows the contact diameter 124 of the contact area 410 to be formed reproducibly with elevated accuracy. This results in good reproducibility of a forward voltage of the optoelectronic device 10. Since the second layer 500 is in practically no electrical contact with the semiconductor crystal 100 in the tolerance region 122 of the uncovered lateral region 120 of the surface 110 of the semiconductor crystal 100, the forward voltage is virtually unaffected by the size of the tolerance region 122. The uncovered diameter 123 of the lateral region 120 which is uncovered during provision of the opening 210 in the first layer 200 thus has practically no effect at all on the forward voltage of the optoelectronic device 10.

When the optoelectronic device 10 is in operation, electromagnetic radiation, for example, visible light is generated in the semiconductor crystal 100. Electromagnetic radiation which leaves the semiconductor crystal 100 through the surface 110 is reflected back into the semiconductor crystal 100 by the first layer 200 and the third layer 600 in order to increase light yield from the optoelectronic device 10.

In the region of the contact area 410, electromagnetic radiation emerging from the semiconductor crystal 100 is at least in part absorbed by the first surface 110. Since almost no adjustment tolerances have to be taken into account when forming the contact area 410, a comparatively small contact diameter 124 of the contact area 410 can be selected and therefore the overall proportion of electromagnetic radiation absorbed at the contact area 410 is low.

Electromagnetic radiation emerging from the semiconductor crystal 100 in the tolerance region 122 of the uncovered lateral region 120 of the surface 110 is only absorbed to a substantially smaller extent than in the region of the contact area 410. Electromagnetic radiation emerging from the semiconductor crystal 100 in the tolerance region 122 of the uncovered lateral region 120 of surface 110 is also substantially reflected on the third layer 600 back into the semiconductor crystal 100. As a result, the achievable light yield of the optoelectronic device 10 is largely independent of the size of the tolerance region 122 and thus also of the uncovered diameter 123 of the uncovered lateral region 120.

The invention has been illustrated and described in greater detail with reference to the preferred exemplary embodiments. The invention is nevertheless not restricted to the disclosed examples. Rather, other variations may be derived by a person skilled in the art without going beyond the scope of protection of the invention.

What is claimed is:

1. An optoelectronic device comprising:
 a semiconductor crystal with a surface comprising a first lateral region, a second lateral region and a third lateral region,
 a contact area arranged on the surface in the first lateral region, the contact area comprising a first metal;
 a first layer comprising a dielectric arranged on the surface in the third lateral region;
 a second layer comprising an optically transparent, electrically conductive material arranged on the contact area, the first layer and the second lateral region of the surface; and
 a third layer comprising a second metal arranged on the second layer.

2. The optoelectronic device according to claim 1, wherein a specific contact resistance between the second layer and the semiconductor crystal is at least one order of magnitude higher than a contact resistance between the contact area and the semiconductor crystal.

3. The optoelectronic device according to claim 1, wherein the second lateral region annularly surrounds the first lateral region at least in places.

4. The optoelectronic device according to claim 1, wherein the third lateral region at least in places annularly surrounds the second lateral region.

5. The optoelectronic device according to claim 1, wherein the optically transparent, electrically conductive material is a transparent, electrically conductive oxide.

6. The optoelectronic device according to claim 1, wherein at least one of the first metal and the second metal is gold or silver.

7. The optoelectronic device according to claim 1, wherein the dielectric comprises $SiO_2$.

8. The optoelectronic device according to claim 1, wherein the third layer is electrically conductively connected to the contact area via the second layer.

9. The optoelectronic device according to claim 1, wherein the first lateral region and the second lateral region together form an uncovered lateral region where the surface of the semiconductor crystal is uncovered by the first layer.

10. The optoelectronic device according to claim 9, wherein the surface of the semiconductor crystal in the uncovered lateral region is uncovered by the third layer.

11. The optoelectronic device according to claim 1, wherein the second layer is completely covered by the third layer on a surface remote from the semiconductor crystal.

12. The optoelectronic device according to claim 1, wherein the first lateral region and the second lateral region are arranged at a bottom of an opening in the first layer.

13. The optoelectronic device according to claim 12, wherein the second layer covers a wall of the opening in the first layer.

14. An optoelectronic device comprising:
 a semiconductor crystal with a surface comprising a first lateral region, a second lateral region and a third lateral region,
 a contact area arranged on the surface in the first lateral region, the contact area comprising a first metal and being configured for electrically contacting the semiconductor crystal;
 a first layer that comprises a dielectric arranged on the surface in the third lateral region, the dielectric serving as a mirror dielectric;
 a second layer comprising a transparent, electrically conductive oxide arranged on the contact area, the first layer and the second lateral region of the surface; and
 a third layer comprising a second metal arranged on the second layer and serving as a mirror layer.

15. An optoelectronic device comprising:
 a semiconductor crystal with a surface comprising a first lateral region, a second lateral region and a third lateral region,
 a contact area arranged on the surface in the first lateral region, the contact area comprising a first metal;
 a first layer comprising a dielectric arranged on the surface in the third lateral region;
 a second layer comprising an optically transparent, electrically conductive material arranged on the contact area, the first layer and the second lateral region of the surface; and
 a third layer comprising a second metal arranged on the second layer, wherein a specific contact resistance between the second layer and the semiconductor crystal is at least one order of magnitude higher than a contact resistance between the contact area and the semiconductor crystal.

* * * * *